(12) United States Patent
Rose et al.

(10) Patent No.: US 6,203,406 B1
(45) Date of Patent: Mar. 20, 2001

(54) AEROSOL SURFACE PROCESSING

(75) Inventors: Peter H. Rose, N. Conway, NH (US); Piero Sferlazzo, Lynnfield, MA (US); Robert G. van der Heide, Nashua, NH (US)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/309,931

(22) Filed: May 11, 1999

Related U.S. Application Data

(62) Division of application No. 08/335,329, filed on Nov. 7, 1994, now Pat. No. 5,931,721.

(51) Int. Cl.$^7$ ..................................................... B24B 1/00
(52) U.S. Cl. ............................... 451/39; 451/38; 451/40; 451/53; 451/99; 451/102
(58) Field of Search ................................. 451/38, 39, 40, 451/53, 99, 102

(56) References Cited

U.S. PATENT DOCUMENTS

| | | |
|---|---|---|
| 1,899,626 | 2/1933 | Miller . |
| 2,699,403 | 1/1955 | Courts . |
| 3,074,822 | 1/1963 | Walk et al. . |
| 3,270,464 | 9/1966 | Bowling, Jr. et al. . |
| 3,545,996 | 12/1970 | Duncan . |
| 3,676,963 | 7/1972 | Rice et al. . |
| 3,702,519 | 11/1972 | Rice et al. . |
| 3,704,822 | 12/1972 | Nomura . |
| 3,708,993 | 1/1973 | Hardt et al. . |
| 3,934,374 | 1/1976 | Leliaert . |
| 3,984,943 | 10/1976 | Kono et al. . |
| 4,038,786 | 8/1977 | Fong . |
| 4,084,357 | 4/1978 | Moses . |
| 4,300,581 | 11/1981 | Thompson . |
| 4,326,553 | 4/1982 | Hall . |

(List continued on next page.)

FOREIGN PATENT DOCUMENTS

| | | |
|---|---|---|
| 0 332 356 A2 | 9/1989 | (EP) . |
| 0 461 476 A2 | 12/1991 | (EP) . |
| 0 585 936 A2 | 3/1994 | (EP) . |
| 2 596 672 | 10/1987 | (FR) . |
| 2 146 926 | 5/1985 | (GB) . |
| 60-3555 | 1/1985 | (JP) . |
| WO 91/03075 | 3/1991 | (WO) . |

OTHER PUBLICATIONS

Elizabeth A. Hill, "Carbon Dioxide Snow Examination and Experimentation", pp. 36–39, PC Feb., 1994.

Phelps et al., "Effects of Fluid Dynamics on Cleaning Efficacy of Supercritical Fluids", Prepared for U.S. Department of Energy under Contract De–AC06–76RLO 1830, Mar. 1993.

Foster et al., A Centrifuge Accelerator $CO_2$ Pellet Cleaning System, Third Annual International Workshop On Solvent Substitution, Phoenix, Arizona, Dec. 8–11, 1992.

(List continued on next page.)

*Primary Examiner*—David A. Scherbel
*Assistant Examiner*—Shantese McDonald
(74) *Attorney, Agent, or Firm*—Fish & Richardson P.C.

(57) ABSTRACT

A scheme for removing foreign material from the surface of a substrate by directing a high velocity aerosol of at least partially frozen particles against the foreign material to be removed. Different schemes are described for accelerating the frozen particles to very high velocities sufficient for particle removal, removal of organic layers (e.g., hard baked photoresist or ion implanted photoresist) and removal of metallic layers. In one embodiment, liquid droplets are entrained in a high velocity gas flow and the resulting gas/liquid mixture is passed through an expansion nozzle to produce a high velocity aerosol of frozen particles. In another embodiment, frozen aerosol particles are entrained in, e.g., a sonic or supersonic gas jet before impacting a surface to be cleaned. The cleaning aerosols may be applied to substrates inside a vacuum chamber or directly from a hand-held device. Also, various scanning systems are described for achieving substantially uniform exposure of the substrate to the cleaning aerosol.

42 Claims, 12 Drawing Sheets

U.S. PATENT DOCUMENTS

| | | |
|---|---|---|
| 4,365,383 | 12/1982 | Bartlett . |
| 4,389,820 | 6/1983 | Fong et al. . |
| 4,401,131 | 8/1983 | Lawson . |
| 4,439,243 | 3/1984 | Titus . |
| 4,458,703 | 7/1984 | Inoue et al. . |
| 4,500,080 | 2/1985 | Aigo . |
| 4,585,517 | 4/1986 | Stemple . |
| 4,597,825 | 7/1986 | Freeouf et al. . |
| 4,631,250 | 12/1986 | Hayashi . |
| 4,655,847 | 4/1987 | Ichinoseki et al. . |
| 4,663,890 | 5/1987 | Brandt . |
| 4,703,590 | 11/1987 | Westergaard . |
| 4,704,873 | 11/1987 | Imaike et al. . |
| 4,705,438 | 11/1987 | Zimmerman et al. . |
| 4,707,951 | 11/1987 | Gibot et al. . |
| 4,727,687 | 3/1988 | Moore . |
| 4,744,181 | 5/1988 | Moore et al. . |
| 4,747,421 | 5/1988 | Hayashi . |
| 4,749,440 | 6/1988 | Blackwood et al. . |
| 4,753,051 | 6/1988 | Tano et al. . |
| 4,756,047 | 7/1988 | Hayashi et al. . |
| 4,778,559 | 10/1988 | McNeilly . |
| 4,793,103 | 12/1988 | Baumgart . |
| 4,806,171 | 2/1989 | Whitlock et al. . |
| 4,817,652 | 4/1989 | Liu et al. . |
| 4,832,753 | 5/1989 | Cherry et al. . |
| 4,857,142 | 8/1989 | Syverson . |
| 4,870,923 | 10/1989 | Sugimoto . |
| 4,871,651 | 10/1989 | McCune, Jr. et al. . |
| 4,900,395 | 2/1990 | Syverson et al. . |
| 4,932,168 | 6/1990 | Tada et al. . |
| 4,936,922 | 6/1990 | Cherry . |
| 4,938,815 | 7/1990 | McNeilly . |
| 4,962,891 | 10/1990 | Layden . |
| 4,974,375 | 12/1990 | Tada et al. . |
| 5,001,873 | 3/1991 | Rufin . |
| 5,009,240 | 4/1991 | Levi . |
| 5,018,667 | 5/1991 | Lloyd . |
| 5,022,961 | 6/1991 | Izumi et al. . |
| 5,025,597 | 6/1991 | Tada et al. . |
| 5,026,155 | 6/1991 | Ockovic et al. . |
| 5,035,750 | 7/1991 | Tada et al. . |
| 5,044,129 | 9/1991 | Olevitch . |
| 5,044,314 | 9/1991 | McNeilly . |
| 5,062,898 * | 11/1991 | McDermott et al. ............ 134/7 |
| 5,074,083 | 12/1991 | Kanno et al. . |
| 5,081,068 | 1/1992 | Endo et al. . |
| 5,108,512 | 4/1992 | Goffnett et al. . |
| 5,119,637 | 6/1992 | Bard et al. . |
| 5,125,979 | 6/1992 | Swain et al. . |
| 5,147,466 | 9/1992 | Ohmori et al. . |
| 5,209,028 | 5/1993 | McDermott et al. . |
| 5,228,206 | 7/1993 | Grant et al. . |
| 5,231,865 | 8/1993 | McDermott et al. . |
| 5,234,540 | 8/1993 | Grant et al. . |
| 5,279,705 | 1/1994 | Tanaka . |
| 5,289,263 | 2/1994 | Kiyokawa et al. . |
| 5,364,474 | 11/1994 | Williford, Jr. . |
| 5,372,652 | 12/1994 | Srikrishnan et al. . |
| 5,931,721 * | 8/1999 | Rose et al. ............ 451/89 |
| 5,967,156 * | 10/1999 | Rose et al. ............ 134/7 |

OTHER PUBLICATIONS

Peterson et al., "Jet Spray Cleaning of Optics", SPIE Proceedings Series, vol. 1754, Jul. 23–24, 1992, San Diego, California.

Tom et al., Particle Formation with Supercritical Fluids–A Review, J. Aerosol Sci., vol. 22, No. 5, pp. 555–584, 1991.

McDermott et al., "Removing Submicron Surface Particles Using a Cryogenic Argon–Aerosol Technique", pp. 33–37 Microcontamination, Oct. 1991.

Sherman et al., "Dry surface cleaning using $CO_2$ snow", J. Vac. Sci. Technol. B., vol. 9, No. 4, Jul./Aug. 1991.

McDermott et al., "Surface Cleaning by a Cryogenic Argon Aerosol", Proceedings—Institute of Environmental Sciences, 1991.

"Cleaning with Supercritical $CO_2$", NASA Tech Briefs, Dec. 1990.

Layden et al., "High velocity carbon dioxide snow for cleaning vacuum system surfaces", J. Vac. Sci. Technol. A 8(5), Sep./Oct. 1990.

Peterson et al., "Contamination Removal by $Co_2$ Jet Spray", SPIE Proceedings Series, vol. 1329, Jul. 10–12, 1990, San Diego, California.

Sherman et al., "The removal of hydrocarbons and silicone grease stains from silicon wafers", J. Vac. Sci. Technol. B 8(3), May/Jun. 1990.

"Ice Scrubbing Effective, Flag Raised Over Organic–Vapor Contamination", Semiconductor Internatioanal Nov. 1990.

Ohmori et al., "Ultra Clean Ice Scrubber Cleaning with Jetting Fine Ice Particles", J. Electrochem. Soc., vol. 137, No. 8, Aug. 1989.

Hoenig et al., "Control of Particulate Contamination by Thermophoresis, Electrostatics and Dry Ice Techniques", 9th ICCCS Proceedings 1988.

ARCO Bulletin, Spectra–Clean™ $CO_2$ .

"Cleaning Surfaces with Dry Ice", Compressed Air Magazine, Aug. 1986.

Hagena et al., "Cluster Formation in Expanding Supersonic Jets: Effect of Pressure, Temperature, Nozzle Size and Test Gas", The Journal of Chemical Physics, vol. 56, No. 5, Mar. 1, 1972.

"Dry Ice Particles Used to Remove Contaminants", Chem. Show Preview, (Before Nov. 1993).

M.M. Hills, "Carbon dioxide jet spray cleaning of molecular contaminants", pp. 30–34, JVSTechnol. vol. 13, No. 1, Jan./Feb. 1995.

* cited by examiner

```
GENERATE AEROSOL —21
        │
        ▼
PROVIDE FLOW OF GAS        —23
FOR ENTRAINING AEROSOL
        │
        ▼
ACCELERATE GAS USED FOR    —25
ENTRAINING AEROSOL
        │
        ▼
DELIVER ENTRAINED AEROSOL  —27
TO FOREIGN MATERIAL TO
BE REMOVED
```

FIG. 2

```
GENERATE AEROSOL —21
        │
        ▼
PROVIDE FLOW OF GAS     —23
FOR ENTRAINING AEROSOL
        │
        ▼
ENTRAIN AEROSOL  —29
        │
        ▼
ACCELERATE GAS/AEROSOL
MIXTURE TO AT LEAST      —25
SONIC VELOCITY
        │
        ▼
DELIVER ENTRAINED        —27
AEROSOL TO FOREIGN
MATERIAL TO BE REMOVED
```

FIG. 2A

```
GENERATE AEROSOL —21
        │
        ▼
PROVIDE FLOW OF GAS     —23
FOR ENTRAINING AEROSOL
        │
        ▼
ACCELERATE GAS
TO AT LEAST              —25
SONIC VELOCITY
        │
        ▼
ENTRAIN AEROSOL  —29
        │
        ▼
DELIVER ENTRAINED        —27
AEROSOL TO FOREIGN
MATERIAL TO BE REMOVED
```

FIG. 2B

AEROSOL SURFACE PROCESSING

This application is a divisional application of U.S. Ser. No. 08/335,329, filed Nov. 7, 1994, now U.S. Pat. No. 5,931,721.

BACKGROUND

This invention relates to aerosol surface cleaning.

Surface cleaning is an important step in making, e.g., semiconductor memories, printed circuits, flat panel displays, and CD-ROMs. Foreign material on a wafer surface has a direct bearing on process yields, especially as device sizes become smaller. Even a very small fraction of a monolayer of sodium ion contamination on the surface of an integrated circuit may cause the circuit to malfunction.

The size of the smallest particle capable of causing a defect in an integrated circuit is decreasing as the semiconductor industry pushes for smaller circuit dimensions. For example, the target resolution for the next generation of semiconductor devices is 0.35 $\mu$m or less, which is already beyond the removal capability of many cleaning technologies. According to a well-accepted rule, foreign material on the order of one tenth of the size of the target resolution should be removed to make a fabrication process commercially viable. Accordingly, surface cleaning processes should remove foreign material on the order of 0.03 $\mu$m in size from the surface of next generation's semiconductor wafers.

In semiconductor cleaning technology, most surface cleaning systems use chemicals in large volumes of purified deionized water that are selected to remove thin organic or oxide films and metal residues. Typically, these cleaning systems require immersing a silicon wafer in a prescribed sequence of one or more baths of liquid cleaning solutions on a wet bench. To reduce the consumption of these expensive solutions, which are also difficult and expensive to dispose of, a number of alternative liquid-based schemes have been devised. For example, in spray cleaning, the liquid cleaning solutions are dispensed as a spray over the surface of a wafer. More recently, a continuous flow liquid cleaning technique has been developed that combines the efficiency of wet bench cleaning and the low consumption features of spray cleaning. Other liquid-based technologies include scrubbing with special rotary brushes, ultrasonic and megasonic cleaners, and liquid jets. Recontamination resulting from recirculation and reuse of liquid chemicals is a potential problem that can only be solved by continuous regeneration on replacement of the cleaning solutions, which considerably increases the costs of the surface cleaning process.

Wafer cleaning chemistry has remained essentially unchanged over the past 25 years, the most prevalent method in the industry still being a hydrogen peroxide-based wet-chemical process. One of the most common cleaning methods in the semiconductor industry is the RCA Standard Clean, in which wafers are immersed in several chemicals sequentially to remove particles, metallic contamination, organic contamination and native oxides.

Since cleaning represents 30% of all the process steps of the fabrication process and very large amounts of water (~1000 gallons/wafer) and chemicals are consumed. After the final rinse, the substrate must be dried, and to avoid "water marks", isopropyl alcohol is often used as a drying agent, which again poses an environmental hazard. The process is therefore expensive and increasingly so as wafer sizes increase, and has a considerable and increasingly worrisome negative environmental impact.

Consequently, there has been a significant desire to move toward gas-phase dry-cleaning processes, such as aerosol surface cleaning, and away from current liquid-based cleaning technologies which require large volumes of cleaning agents (acids, bases and solvents) and larger volumes of deionized rinse water, which must be properly disposed of at a great expense.

As used herein, we intend the term "aerosol" to broadly refer to a gaseous suspension of microscopic particles of a liquid, a solid, or a mixture of solid and liquid.

Aerosols of carbon dioxide snow have been used for many years to clean surfaces. For example, Swain et al. (U.S. Pat. No. 5,125,979, which is herein incorporated by reference) describe a scheme in which liquid carbon dioxide is expanded from an orifice into a thermally insulated chamber to form small carbon dioxide particles. The small carbon dioxide particles are retained in the insulated chamber until they agglomerate into large snowflakes, at which point the snowflakes are accelerated within a nozzle by a high velocity vortex of a gas and directed against a surface to be cleaned.

Hand-held carbon dioxide snow cleaners are also known. For example, Layden et al. ("High velocity carbon dioxide snow for cleaning vacuum system surfaces," *J. Vac. Sci. Technol.*, A 8 (5), Sep/Oct 1990, which is herein incorporated by reference) describe a carbon dioxide cleaner in which ultra pure carbon dioxide is expanded from a gas cylinder through a converging/diverging nozzle. The cleaner is implemented as a gun-shaped device with a thumb-actuated handle. J. F. Williford ("Enhanced $CO_2$ Spray Removal of Fine Particulate Contamination by Spinning the Work under the Spray," *Microcontamination* '94, which is herein incorporated by reference) describes a scheme for achieving enhanced particulate removal by increasing the relative velocity between a carbon dioxide aerosol spray and a substrate to be cleaned. The substrate is rotated at 3,600–6,000 rpm in a direction counter to the direction of spray impingement.

Levi (U.S. Pat. No. 5,009,240, which is herein incorporated by reference) describes a wafer cleaning system which cleans semiconductor wafers by sandblasting them with ice particles. In this system, a stream of gas entrains frozen ice particles through an L-shaped conduit to the surface of a wafer to be cleaned. After the semiconductor wafer is sandblasted with ice, residual ice is removed by evaporation.

Aerosols of solid cryogenic argon particles have also been used to clean contamination from a substrate surface. McDermott et al. (U.S. Pat. Nos. 5,209,028 and 5,062,898, both of which are herein incorporated by reference) disclose a semiconductor wafer cleaning system in which a pressurized gaseous argon-containing stream, which is at a temperature above the liquefaction point of argon, is expanded and thereby solidified to form an aerosol of frozen argon particles. The resulting aerosol is directed at a surface of wafer to be cleaned. Preferably a nitrogen carrier gas is used to accelerate the argon particles.

As used herein, we intend the term "cryogenic" to broadly refer to a physical substance (atoms, compounds, molecules, or a mixture of one or more of these components) in which at least one of its physically separable constituent components has a liquefaction temperature of less than about 110° K at atmospheric pressure (e.g., argon, hydrogen, helium, nitrogen, oxygen, air, or methane).

Other compounds have been used in the formation of particulate cleaning aerosols. For example, Ohmori et al. (U.S. Pat. No. 5,147,466, which is herein incorporated by reference) describe a surface cleaning technique which uses an aerosol of frozen particles formed from various compounds selected based on the hardness of the resulting frozen particle. The compounds from which these aerosols are formed include water, methanol, glycerin, and freon 113.

While such cleaning schemes have proven to be somewhat effective for removing particles, improved cleaning results are required before such dry processes can become commercially successful. In particular, a replacement cleaning technology must be able to remove other forms of surface contamination, such as photoresist, oily residues (e.g., fingerprints), and residue from previous processing steps (e.g., ion implantation). This is especially true in the semiconductor industry, where it is necessary to clean semiconductor substrates at least as well as currently used wet cleaning techniques.

SUMMARY

In a general aspect, the invention features a scheme for removing foreign material from the surface of a substrate by directing a high velocity aerosol of at least partially frozen particles against foreign material to be removed, the method comprising the steps of: generating an aerosol of at least partially frozen particles; providing a flow of a gas having a temperature above the freezing point of the aerosol particles for entraining the aerosol of at least partially frozen particles; entraining the aerosol particles in the gas; accelerating the gas to at least sonic velocity; and delivering the entrained aerosol particles to foreign material to be removed from the surface of the substrate.

Cleaning according to the present invention enables a broad class of foreign material, including particulates, organic layers and metallic contamination, to be removed from the surface of a substrate without damaging the substrate and features on the substrate. It has been discovered that the high aerosol particle velocities achieved by the present invention not only enables particle removal, but also enables removal of organic layers (e.g., hard baked photoresist or ion implanted photoresist) and metallic layers. It is speculated that higher velocities are achieved over other techniques because the gas is accelerated separately from the aerosol particles, which enables sonic and supersonic velocities to be attained. Using gas at a temperature above the freezing point of the aerosol particles provides higher expansion ratios, enabling higher aerosol velocities to be achieved.

Embodiments of the invention may include one or more of the following features. The gas flow may be provided at a temperature of about 300° K. The step of entraining the aerosol particles in the gas flow is performed before the step of accelerating the gas to at least sonic velocity. The step of entraining the aerosol particles in the gas flow is performed after the step of accelerating the gas to at least sonic velocity. The foreign material to be removed may comprise a layer of hard-baked photoresist, a layer of ion-implanted photoresist, or fingerprints. The step of generating an aerosol may comprise generating an aerosol of cryogenic particles (e.g., argon).

In one aspect of the invention, foreign material is removed by an apparatus comprising: a vacuum chamber having a selected chamber pressure while foreign material is being removed from the substrate; an aerosol-forming expansion nozzle having a plenum and at least one orifice providing fluid communication between the plenum and the vacuum chamber, the plenum having a selected plenum pressure while foreign material is being removed from the substrate; a liquid aerosol generator for providing a supply of liquid droplets entrained in a gas flow; and a conduit coupled between the liquid aerosol generator and the plenum of the aerosol-forming expansion nozzle for delivering the entrained flow of liquid droplets over a substantial path from the liquid aerosol generator to the plenum, the liquid droplets entrained in the gas flow entering the vacuum chamber through the at least one orifice, the pressure differential experienced by the liquid droplets as they pass into the vacuum chamber being selected so that the liquid droplets at least partially freeze to form a high velocity aerosol of frozen particles that impinge on and remove the foreign material from the surface of the substrate.

Among the advantages of this technique are the following. Forming the aerosol particles separately from the entraining gas flow permits more gas to be mixed with the aerosol particles in the expansion nozzle to achieve higher velocities. Due to gas-phase expansion, high aerosol velocities are easily achieved by merely controlling the delivery parameters of the entraining gas flow. The size of the frozen particles can be selectively controlled and "tuned" so that only fine particles having a generally uniform distribution are used to clean the substrate surfaces. Furthermore, larger particles which are less efficient for cleaning relatively small surface features can be easily collected for re-use. This considerably reduces the overall consumption of liquid required to achieve a prescribed cleaning result.

Embodiments according to this aspect of the invention may include one or more of the following features. The liquid aerosol generator may comprise a gas jet coupled to a supply of a gas for delivering an entraining flow of gas to the conduit, the entraining flow of gas atomizing liquid into liquid droplets and entraining the liquid droplets. The gas in the entraining flow may be delivered to the liquid aerosol generator at a temperature of just above the triple point temperature of the liquid droplets and below about 300° K. The liquid aerosol generator may comprise a feed tube extending into a supply of liquid, the feed tube being Venturi-pumped as a result of the entraining flow of the gas. The liquid aerosol generator may be DeVilbiss aerosol generator. The conduit may comprise an impactor positioned to intercept a portion of the entrained flow of liquid droplets so that the average size of the liquid droplets reaching the nozzle plenum is reduced relative the average size of the liquid droplets in the liquid aerosol prior to being intercepted by the impactor. The impactor may be adapted to collect the intercepted liquid droplets for re-use. The conduit may be adapted so that the average size of the liquid droplets reaching the nozzle plenum is controlled by the velocity of the entraining flow of gas. The area of exposure of the aerosol particles on the surface of the substrate at any given instant may be substantially less than the total surface area of the substrate to be cleaned and scanning means may be provided for achieving substantially uniform exposure of the surface area to be cleaned to the aerosol particles. The scanning means may comprise means for rotating the substrate about an axis. The at least one orifice may be adapted to accelerate the frozen particles to nearly sonic velocities (e.g., the orifice may be in the form of a cylindrical tube having a proximal conical section that converges to a throat coupled to a distal diverging conical section). The orifice of the aerosol-forming expansion nozzle may be adapted to deliver the aerosol of frozen particles at an oblique angle relative to the surface of the substrate. At least one other aerosol-forming expansion nozzle may be provided for directing an aerosol of frozen particles at the material to be removed along a path different from that provided by the first aerosol-forming expansion nozzle. The size of the orifice may be preselected to control the average size of frozen particles in the aerosol used to remove the foreign material from the substrate. A high velocity gas nozzle may be provided which is separate from the aerosol-forming expansion nozzle and located proximal to the foreign material to be removed from the substrate; the high velocity gas nozzle providing a high velocity flow of a gas that entrains the aerosol of frozen particles and delivers the frozen particles to the foreign material at a velocity substantially greater than the velocity of the particles prior to being entrained in the high velocity gas flow.

In another aspect, the invention features an apparatus comprising: a vacuum chamber having a selected chamber pressure while foreign material is being removed from a substrate; an aerosol-forming expansion nozzle having a plenum and at least one orifice providing fluid communication between the plenum and the vacuum chamber, the plenum having a selected plenum pressure while foreign material is being removed from a substrate, the plenum being coupled to a supply of liquid that at least partially freezes to form an aerosol of frozen particles as a result of passage through the at least one orifice into the vacuum chamber; and a high velocity gas nozzle located proximal to the foreign material to be removed from the substrate, the high velocity gas nozzle providing a high velocity flow of a gas that entrains the aerosol of frozen particles and delivers the frozen particles to the foreign material at a velocity substantially greater than the velocity of the particles prior to being entrained in the high velocity gas flow.

Embodiments according to this aspect of the invention may include one or more of the following features. The orifice may be adapted to accelerate the frozen particles to nearly sonic velocities. The orifice may be in the form of a cylindrical tube having a proximal conical section that converges to a throat coupled to a distal diverging conical section. The aerosol-forming expansion nozzle may be positioned to deliver the aerosol of frozen particles at an oblique angle relative to the surface of the substrate. The size of the at least one orifice may be preselected to control the average size of frozen particles in the aerosol used to remove the foreign material from the substrate.

Such a scheme reduces the deceleration of the high velocity jets, and reduces the time that the aerosol jet is entrained in the high velocity jets to a minimum, thus limiting the evaporation of the frozen aerosol particles. This is particularly advantageous because it is highly desirable to use room temperature gases for the production of the high velocity gas jets. It is possible that a more than ten-fold increase in the velocity of the aerosol can be achieved by this technique (e.g., typical aerosol velocities could be increased from 500–2,000 cm/sec to 10,000–30,000 cm/sec or greater).

In yet another aspect, the invention features a hand-held apparatus comprising: a housing having a liquid input port for receiving liquid and a carrier gas input port for receiving a carrier gas; a liquid feedtube having a proximal end coupled to the liquid input port and having a distal end for providing an aerosol of frozen particles; a carrier gas feedtube having a proximal end coupled to the carrier gas input port and having a distal end; and a high velocity gas nozzle having a proximal end coupled to the distal end of the gas feedtube and having a distal end located proximal to the foreign material to be removed from the substrate, the high velocity gas nozzle providing a high velocity flow of a gas that entrains the aerosol of frozen particles and delivers the frozen particles to the foreign material at a velocity substantially greater than the velocity of the particles prior to being entrained in the high velocity gas flow.

The liquid feedtube and the carrier gas feedtube may be coaxially disposed about one another, or they may be disposed side-by-side.

In a further aspect, the invention features an apparatus comprising: an expansion nozzle having proximal and distal ends and defining a conduit having at least a portion that converges from the proximal end of the expansion nozzle to the distal end thereof for accelerating a gas therethrough; a liquid channel having a proximal end for extending within a container of a pressurized liquid and having a distal end with an opening for generating an aerosol of at least partially frozen particles from liquid passing through the liquid channel; and a gas channel having a proximal end with an opening at the top of the container of a pressurized liquid and having a distal end fluidly coupled to the proximal end of the expansion nozzle, the gas channel delivering a gas from the container of liquid to the vicinity of the distal end of the liquid channel for entraining the aerosol particles and accelerating the particles as the gas passes through the expansion nozzle.

The apparatus is preferably adapted to be hand-held and preferably further comprises a hand-actuated trigger for selectively controlling the delivery of the high velocity aerosol to the foreign material to be removed.

Using hand-held cleaners is particularly useful for substrates that are too large to be placed inside a vacuum chamber. Use of a hand-held cleaner also increases throughput (e.g., because the doors of the vacuum chamber do not have to be opened and closed).

Cleaning with low volumes of aerosols results in low volumes of relatively harmless exhaust gases and airborne impact components of foreign material. This reduces the environmental impact of the cleaning process and increases operator safety, compared with the standard wafer cleaning practice in which large volumes of acids, bases, solvents, and even larger volumes of contaminated rinse water are used. Aerosol surface cleaning according to the present invention provides the advantage over current wet cleaning processes in that aerosol surface cleaning can be readily incorporated into current semiconductor vacuum cluster tool processing systems.

An object of the present invention is to achieve high cleaning efficiency with relatively small frozen particles accelerated to a high velocity. One reason for the effectiveness of this approach is that a very fine aerosol accelerated to high velocity will penetrate, and therefore clean, submicron trenches and vias typically present on, e.g., semiconductor and other microelectronic substrate surfaces. The use of a plurality of nozzles for directing the aerosol in various directions further enhances the cleaning result.

Size, density and velocity of the frozen particles are the most important parameters affecting cleaning efficiency. The invention provides a new level of insight into conditions that can occur during aerosol surface cleaning that enables the velocity of the particles in the aerosol to be easily increased without increasing the consumption of the liquid or increasing the cooling power requirements of the system.

Other features and advantages will become apparent from the following description and from the claims.

DESCRIPTION

FIGS. 2–2B are flow diagrams of surface processing schemes.

Figure 1:
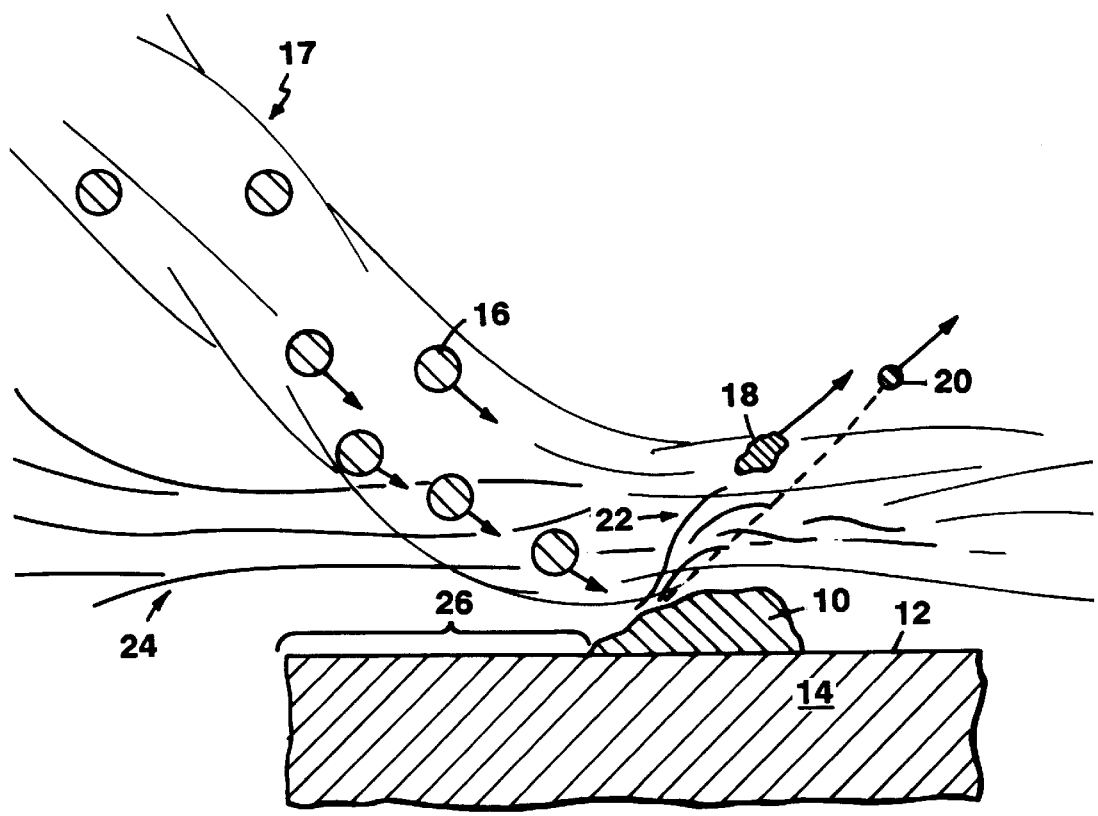
FIG. 1 is a diagrammatic side view of a surface region of a substrate being processed.

Referring to FIG. 1, foreign material 10 (e.g., contaminants, such as particles, dust, lint, metals; organic layers, such as patterned photoresist layers, oils and fingerprints; or residues) may be removed from a surface 12 of a substrate 14 by delivering to the foreign material an aerosol of frozen particles 16 accelerated to a high velocity by a gas jet 17 of at least sonic velocity. Particles 16 are at least partially frozen before impacting the foreign material to transfer sufficient energy to the foreign material to dislodge portions 18 from the surface. Portions 18 are released from the surface if the transferred energy is sufficient to overcome the adhesion energy holding the foreign material to the surface. After the particles impact the foreign material, they may be removed from the vicinity of surface 12 as particles 20 or they may evaporate into a gas 22. A flush gas 24 (e.g., nitrogen) is applied at an oblique angle relative to surface 12 to entrain the impact by-products (ejected portions 18 of the foreign material, particles 20 and gas 22) and remove them from the vicinity of the cleaned portion 26 of the substrate surface.

We note that the "sonic velocity" of a gas depends on many parameters including the density of the gas and the temperature of the gas.

Referring to FIG. 2, the following steps are performed during a typical surface processing procedure. An aerosol of solid or liquid particles is generated (21). A flow of a gas used for entraining the aerosol particles is provided (23). The gas used for entraining the aerosol particles is accelerated to at least sonic velocities (25). The entrained aerosol is delivered to the foreign material to be removed from the surface of the substrate (27). The step of entraining the aerosol particles (29) may be performed before or after the entraining gas is accelerated to at least sonic velocities, as shown in FIGS. 2A and 2B, respectively.

We have realized that by separating the step of generating the aerosol of particles from the step of accelerating the aerosol particles, each step may be separately optimized to achieve better cleaning results. Careful selection of certain cleaning conditions (e.g., particle velocity, particle density and particle size) ensures that the foreign material is completely removed from the surface and does not redeposit onto the surface. Sufficiently high particle velocities can be achieved using this technique to remove many different kinds of foreign material from the surface of a substrate without damaging the substrate and without damaging features on the substrate.

Substrate 14 (FIG. 1) may be heated to avoid excessive cooling and possible damage to structural surface features on the substrate. Heating the substrate helps to prevent redeposit of particulate impact components and helps to sublimate the impinging aerosol particles. The substrate may be heated by resistive heating of a substrate holder which is in direct thermal contact with the substrate. Alternatively, the substrate may be heated by an infrared light source.

Figure 3:
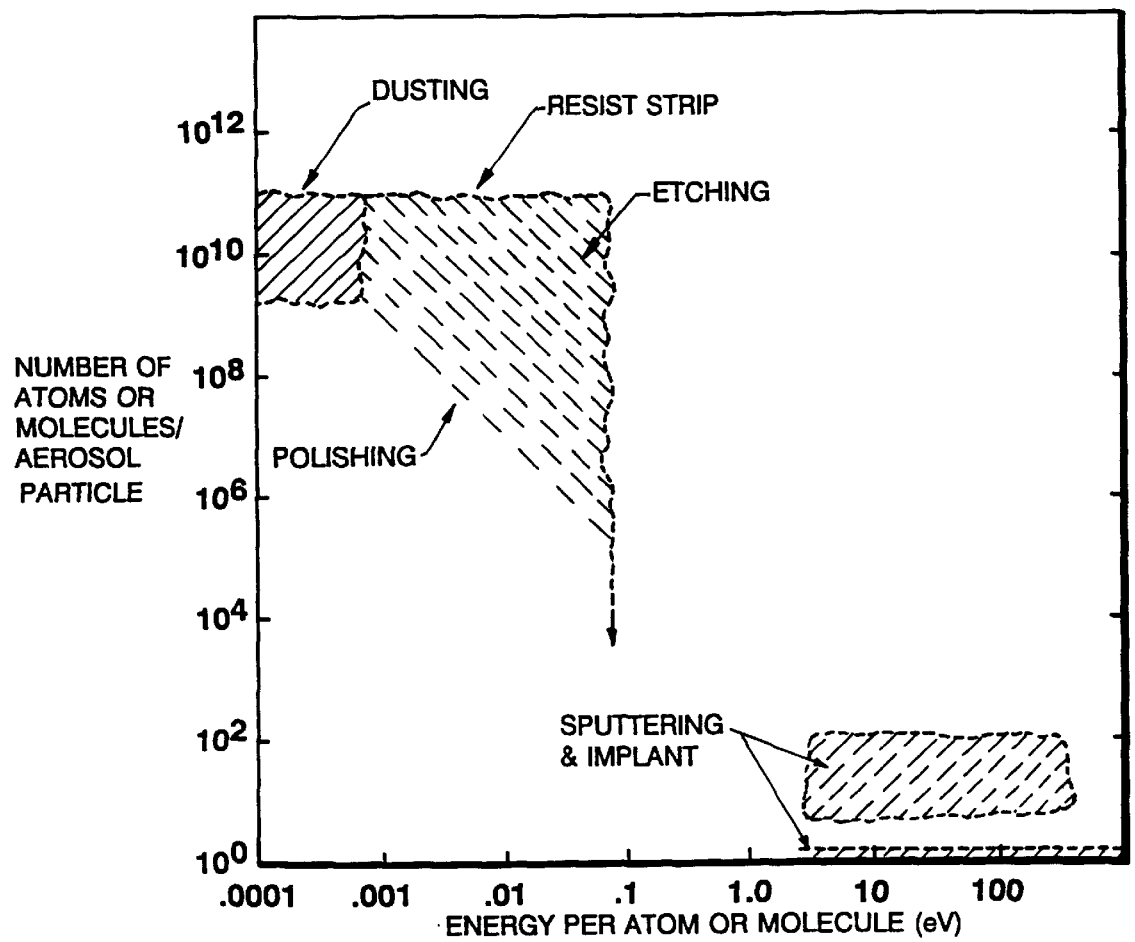
FIG. 3 is a diagram illustrating different processing regimes as a function of the average number of particles or atoms per aerosol particle and the average energy per atom or molecule.

Referring to FIG. 3, different "cleaning regimes" (dusting, resist stripping, polishing, etching) can be classified on the basis of the average number of atoms or molecules per aerosol particle (indicative of the average size of the aerosol particles) and the average energy per atom or molecule of the aerosol particles (indicative of the average energy or velocity of the aerosol particles). The size and energy of the particles in the aerosol used for cleaning are selected depending on the desired application. The dusting regime is useful for removing loosely held particles such as silicon dust or small masses of loosely held organic molecules. The resist stripping regime is useful for stripping organic films (e.g., photoresist, fingerprints, and oils) from substrate surfaces. The etching regime is used for removing, e.g., silicon dioxide films or aluminum layers from substrates. The polishing regime is selected, e.g., to polish a semiconductor or metallic surface to a mirror-like finish. The sputtering and implant regimes are shown to provide a sense of scale regarding the many orders of magnitude difference in particle sizes and energies that are useful for cleaning relative to the sizes and energies required for sputtering or implanting.

The characteristics of the aerosol particles are selected to achieve efficient cleaning of the foreign material from the surface of the substrate, without damaging the substrate and without damaging features on the substrate surface. The average size of the aerosol particles is typically selected to include about $10^7$ to $10^{10}$ atoms (or molecules) per particle, with the average energy of each atom (or molecule) being typically between about 0.1 meV and 0.01 eV. The average velocity of the aerosol particles is typically maintained between 2,000 cm/sec and 30,000 cm/sec, and more preferably between 5,000 cm/sec and 10,000 cm/sec. Also, depending on the substrate to be cleaned, the so-called "hardness" of the particles may be selected to achieve efficient cleaning without damage.

Cleaning Chambers

Figure 4:
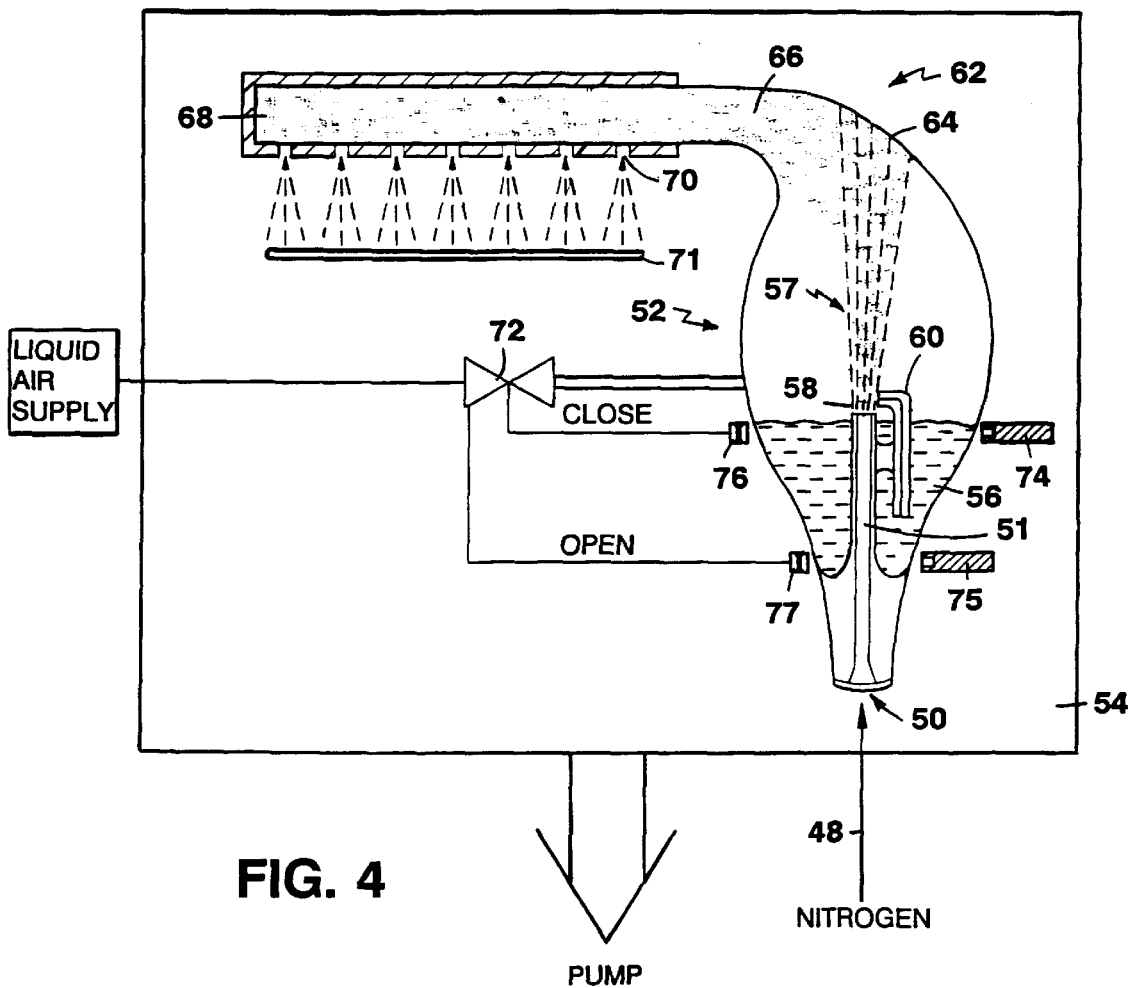
FIG. 4 is a diagrammatic side view in partial cross-section of a surface processing system.

Referring to FIG. 4, a pressurized gas 48 (e.g., nitrogen) from an ultra-clean pressurized supply is fed into an inlet 50 of a nozzle 51 of a liquid aerosol generator 52, which is housed inside a vacuum chamber 54. In a preferred embodiment nitrogen gas 48 is delivered to inlet 50 at room temperature (e.g., about 20°–30° C.), at flow rate of preferably 2–10 SCFM (standard cubic feet per minute), and more preferably, in the present embodiment, at about 5 SCFM, and at a pressure of about 120 psi. A liquid or gas (e.g., argon or carbon dioxide) is pre-cooled outside of the vacuum chamber (e.g., by a heat-exchanger) so that all of the gas is liquefied. The pre-cooled liquid is then delivered to a reservoir 56 inside the liquid aerosol generator.

Liquid aerosol generator 52 is shown to be of the DeVilbiss-type to illustrate this concept. It will occur to those skilled in the art that, in other embodiments, other types of aerosol generators may be used in another arrangement without substantially altering the results of the aerosol cleaning process.

Pressurized nitrogen gas 57 exits nozzle 51 through an outlet 58 at a relatively high velocity causing a Venturi pump effect on a liquid feed tube 60 that extends into reservoir 56. The Venturi pumping draws liquid from reservoir 56 through the feed tube. At the outlet of the feed tube the liquid becomes entrained in the high velocity flow of nitrogen 57. Upon impacting the nitrogen gas, the liquid is atomized or nebulized (mechanically subdivided) into small liquid droplets that are entrained and accelerated by nitrogen gas flow 57.

It is presently preferred that the entraining gas flow is maintained at room temperature for a number of reasons. It is less costly to use a gas at room temperature than it is to cool a gas. Also, it is desirable for the liquid droplets formed by the liquid aerosol generator to remain in liquid form rather than solidify because of the possibility that nozzle 68, near expansion orifices 70, will become cold enough to cause material to accumulate at the orifices. This accumulation could block the orifices or create large frozen particles that could become entrained in the pressurized gas flow, pass through the orifices, and be accelerated to high enough velocities to damage the surface of substrate 71. This allows the particle size to be easily selected by controlled evaporation of the droplets in the transport conduit.

The liquid aerosol generator includes a liquid transport conduit 62 that turns to form a 90° angle relative to the axis of gas nozzle 51. Larger liquid droplets are not well entrained in the turning nitrogen flow, impact a wall 64 (impactor), and drain back into liquid reservoir 56. Smaller liquid droplets entrained in gas flow 57 continue into a plenum 66 of an aerosol-forming expansion nozzle 68. Other liquid transport conduit shapes may also be used to achieve the desired tuning (i.e., selection) of liquid particle sizes that are delivered to nozzle 28. For example, a hemispherical barrier or a series of baffles positioned in the carrier gas jet may be used.

By selecting the velocity and flow rate of pressurized gas 57 and by selecting the shape and size of conduit 62, the size of the liquid droplets reaching plenum 66 can be restricted to a desired size range. This permits an enhanced control of the sizes of the resultant frozen particles used to remove foreign material from the surface of a substrate.

The high velocity aerosol of at least partially frozen particles is generated by passing the gas/liquid droplet mixture through one or more orifices of an aerosol-forming expansion nozzle into a vacuum chamber that has a chamber pressure preferably below the triple-point pressure of the liquid (e.g., 0.68 atm for argon). The "triple-point" is generally defined as the temperature and pressure at which the solid, liquid and vapor of a substance are in equilibrium. In the specific embodiment using an argon-containing aerosol, the pressure inside nozzle plenum 66 is preferably maintained at about 50–100 psi, and in the present embodiment preferably at about 80 psi. The entrained liquid droplets that reach plenum 66 are accelerated out of nozzle 68 by passage through orifices 70. The pressure drop experienced by the argon liquid droplets, as they pass through the orifices, is preferably about 45–95 psi, and in the present embodiment more preferably about 75 psi.

The orifices are preferably circular and have a diameter on the order of 0.007 inch. The individual orifices are preferably spaced-apart a distance of about 3/16 of an inch and define a converging/diverging conduit to accelerate the gas/droplet mixture to at least sonic velocities. The substrate would be linearly translated relative to the aerosol generated by nozzle 64 to achieve substantially uniform exposure of the substrate to the aerosol. Alternatively, a single-orifice nozzle could be used in combination with two-dimensional scanning. The resulting adiabatic expansion of the gas-liquid droplet mixture leaving nozzle 68 induces the entraining gas to accelerate up to at least sonic velocities (e.g., up to about 30,000 cm/sec at 300° K) at the output of the nozzle. If the pressure in the chamber is below the triple-point for the liquid droplets, the droplets will solidify (e.g., for argon, the triple-point is at 0.68 atm and 84° K). Higher velocities can be achieved by entraining the resulting aerosol in a sonic or supersonic gas flow, described in detail below.

A solenoid valve 72 is connected to a heat exchanger which produces high purity liquid (e.g., argon of carbon dioxide) for replenishing the liquid in reservoir 56. Liquid level sensors are used to open valve 72 when the liquid level is low and close the valve when the liquid level is high. For this reason high level and low level laser diodes 74, 75 generate laser signals through windows in the wall of the liquid aerosol generator and photodetectors 76, 77 are arranged to detect any variation in the generated signal intensity transmitted through the liquid. Instead of using windows, the respective wall of the liquid reservoir may be made of a transparent material (e.g., fused quartz or lucite).

Figure 5:
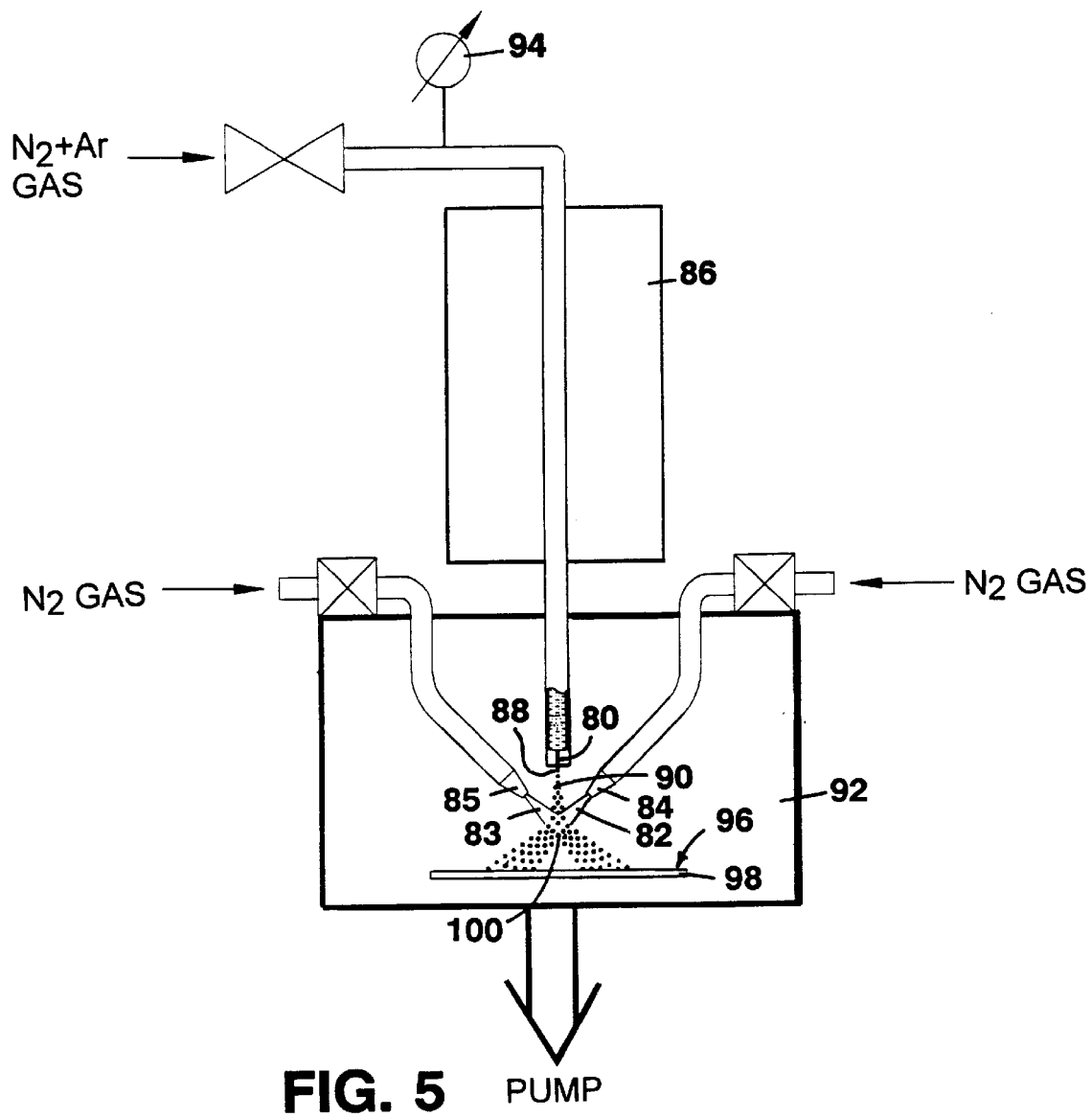
FIG. 5 is a diagrammatic side view of a surface processing system.

Referring to FIG. 5, in an alternative embodiment, an aerosol, which may be of relatively low velocity, is produced by an aerosol-forming expansion nozzle 80 and is subsequently accelerated in high velocity (at least sonic velocity) flows 82, 83 of gas (e.g., nitrogen) delivered by one or more gas nozzles 84, 85. An input including liquid components (e.g., a mixture of pressurized condensable gases, such as argon and nitrogen) is precooled in a heat exchanger 86 to achieve partial or total liquefaction of the liquid components, which are then expanded through an orifice 88 into a vacuum chamber (maintained at a reduced pressure relative the pressure inside the nozzle), to form a jet of at least partially frozen particles 90.

Whether the aerosol is solid or liquid depends on the particular thermodynamic conditions of the aerosol cleaner. In particular, to achieve frozen particles it is preferable that the pressure of the vacuum chamber 92 be maintained below the triple-point of one or more of the liquid components introduced into the heat exchanger. For example, in the case of a mixture of argon and nitrogen, the pressure inside the vacuum chamber should be below about 0.68 atm (i.e., the triple point of argon) to produce frozen argon particles. A pressure gauge 94 is used to monitor the pressure inside the nozzle so that the pressure difference between the nozzle plenum and the vacuum chamber is at a preferred pressure drop or differential (e.g., 45–95 psi, and more preferably about 75 psi).

The aerosol jet of at least partially frozen particles 90 is then intercepted at a location, between orifice 88 of aerosol-forming expansion nozzle 80 and a surface 96 of a substrate 98 to be cleaned, by high velocity gas flows produced through gas nozzles 84, 85, which are designed to provide sonic or supersonic gas jets 82, 83 of high enough velocity and flow rate to be capable of entraining the aerosol jet and directing it toward the surface at high velocities. Preferably, entraining flows 82, 83 increase the velocity of the aerosol to about 5,000–60,000 cm/sec. It has been determined that a more than ten-fold increase in the velocity of the aerosol could be achieved by this technique (e.g., typical aerosol velocities may be increased from 500–2,000 cm/sec to 5,000–60,000 cm/sec).

Two gas nozzles (84, 85) are shown in FIG. 5, however, alternative embodiments may include any practical number of one or more high velocity gas nozzles.

The orientations of the nozzles, the aerosol jet, and the substrate surface can be varied to achieve optimal cleaning of three-dimensional structures on the surface of the substrate (e.g, to eliminate the shadowing effects of such structures). This is particularly advantageous in the case of patterned semiconductor wafers which require cleaning of deep trenches, vias, side walls and grooves. Preferably, nozzles 84, 85 are oriented to deliver the high velocity gas flows at an angle between 20° and 60° relative to the surface of the substrate.

In a preferred embodiment, the distance between nozzles 84, 85 and the surface is kept as small as possible (e.g., 1–2 cm). Preferably, the intersection point 100 between the low velocity aerosol and the high velocity gas flows is about 0.6–1.25 cm above the surface of the substrate. The distance between intersection point 100 and orifice 88 of expansion nozzle 80 is also selected to be as close as practically possible.

Figure 6:
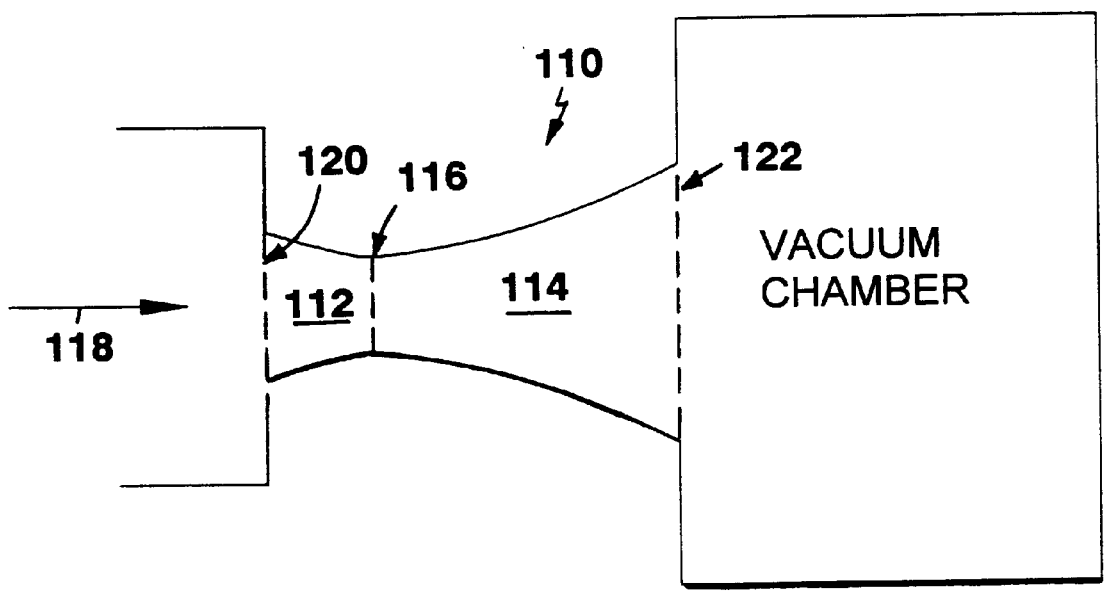
FIG. 6 is a diagrammatic side view of a nozzle.

Referring to FIG. 6, a supersonic nozzle 110, which may be used for nozzles 84 or 85, includes two conical sections 112, 114; one (112) converging to and one (114) diverging from a reduced diameter throat section 116. In the specific embodiment using an argon-containing aerosol, converging section 112 tapers from an input 120 of inner diameter 0.05 cm to the throat of inner diameter of 0.025 cm, whereas, the diverging section tapers outward for a distance of 0.25 cm from the throat to an output 122 of inner diameter 0.25 cm.

Pressurized nitrogen gas 118 entering the nozzle from the converging section is accelerated to sonic velocities (10,000–30,000 cm/sec) up to the nozzle throat. Since the pressure along the nozzle is decreasing, the effect of the diverging section is to further accelerate the gas to supersonic velocities (30,000–60,000 cm/sec). The energy required to achieve this result is taken from the thermal energy of the gas, which causes a considerable amount of cooling to take place. In addition to high velocities, a supersonic nozzle achieves the desirable result of reducing, by cooling, the temperature differential between the accelerating gas flows and the aerosol, reducing the evaporation of the aerosol before it impacts the substrate surface.

As discussed above, the size, density and velocity of the aerosol of at least partially frozen particles are critical parameters affecting cleaning efficiency. While the above discussion has focussed primarily on aspects associated with cryogenic (e.g., argon) aerosol cleaning, the techniques described herein can be applied to other aerosol cleaning techniques, such as carbon dioxide snow cleaning, for increasing the velocity of the aerosol without increasing the consumption of the aerosol components, or increasing the cooling power requirements of the system.

A substrate to be cleaned is preferably loaded into the cleaning chambers by robot arms, such as those that are frequently used in the semiconductor industry. The substrate preferably sits on a holder that may reciprocate linearly back-and-forth, rotate about an axis, or translate along two dimensions in, e.g., a zig-zag pattern, to achieve uniform exposure of the surface to the cleaning aerosol, as described in detail below.

Scanning Systems

As discussed above, in certain preferred embodiments, the area of each cleaning aerosol jet at the substrate surface is on the order of 0.1–4 $cm^2$, which is much less than the total surface area of the substrate, which may be on the order of 300 $cm^2$. Consequently, to achieve uniform exposure of the substrate to the cleaning aerosol, several scanning systems have been devised.

Keeping the area exposed to the cleaning aerosol small provides a number of important advantages. Smaller exposure areas allow smaller aerosol sprays to be used, enabling commercially viable electronic cryogenic refrigerators (e.g., with power requirements on the order of 200–500 watts) to be used rather than liquid nitrogen-based refrigeration systems. Also, use of a smaller exposure area in combination with mechanical scanning achieves more efficient use of the aerosol relative to aerosol cleaning systems that use larger areas of exposure by reducing the amount of aerosol that does not impinge on the substrate.

Figure 7:
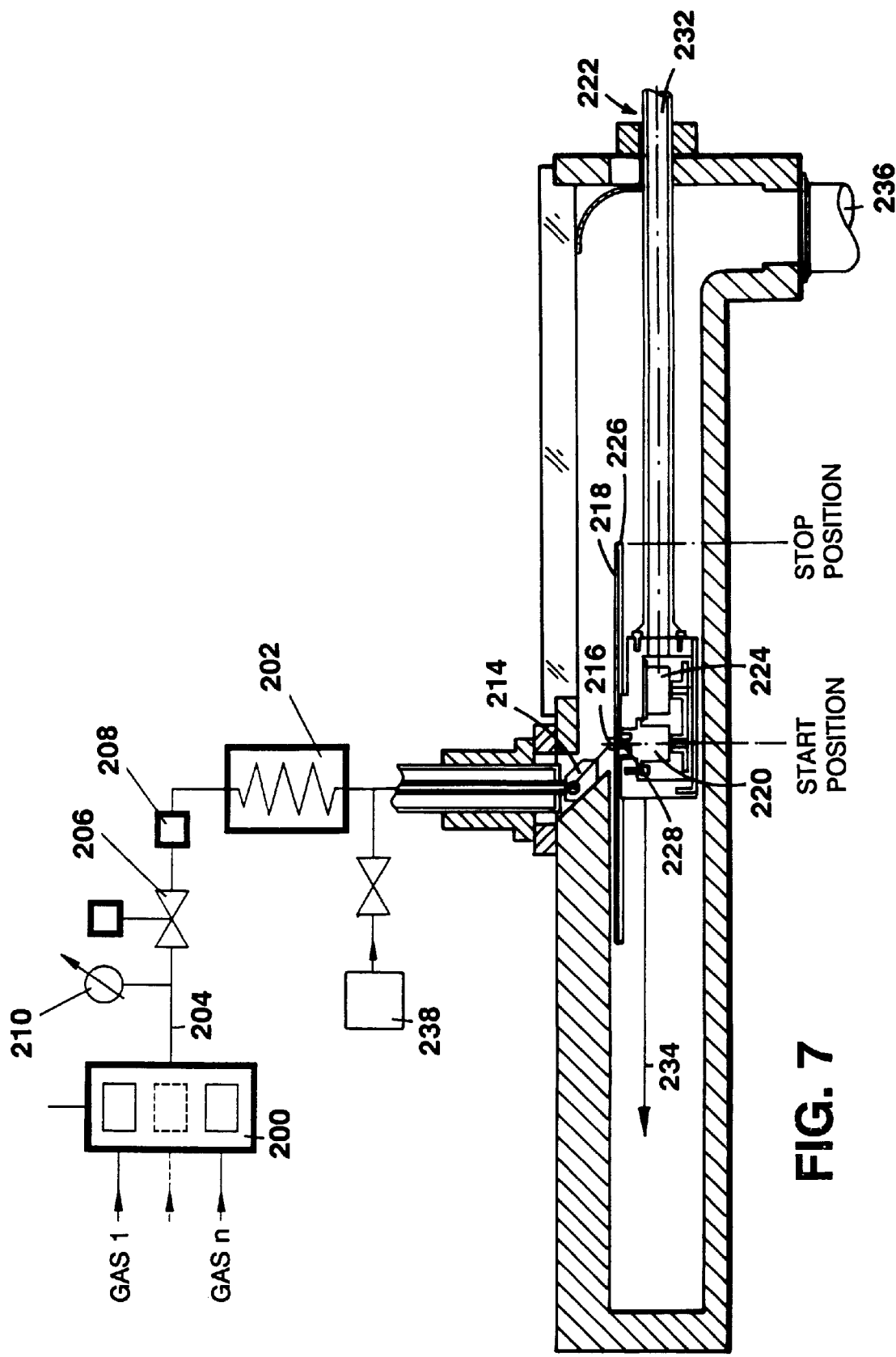
FIG. 7 is a cross-sectional side view of an alternative processing system.

Referring to FIG. 7, a process gas, which may be a single type of gas or a combination of high purity gases (e.g., argon, nitrogen, helium, oxygen, and hydrogen) mixed in various proportions in a manifold 200, is supplied to a heat exchanger 202 via a supply line 204, which includes a valve 206 and a filter 208. The pressure of the process gas is indicated by a pressure gauge 210. Some or all of the gases are partially or completely liquified at an exit port of the heat exchanger. This liquid is expanded through a nozzle 214 to form a jet 216 of frozen particles made of one or more of the components of the original process gas. These frozen particles impinge on the substrate 218 to be cleaned.

The entire surface of the substrate is cleaned by a combination of fast rotational motion (e.g., on the order of 100 rpm) and slow linear translation, which is provided by the rotary motor 220 and the linear drive 222, respectively. The rotary motor assembly 220 is kept at atmospheric pressure in the sealed enclosure 224 beneath the substrate holder 226. The rotary action is transmitted to the substrate holder via a feed-through 228. Power and control signals are supplied to the motor 220 through cables running through a hollow shaft 232 of linear drive 222.

The nozzle is oriented at 20° to 60° relative to the normal to the substrate 218. This helps entrain and remove impact by-products or other dirty gases by creating a flow across the substrate surface toward a vacuum exhaust port 236. This reduces redeposit of foreign material onto the substrate surface.

Due to the different rotational velocities at radial positions on the substrate, it is beneficial to vary the linear motor speed as a function of linear position of the substrate relative to the cleaning aerosol. For example, to achieve uniform exposure to the cleaning aerosol, the velocity of the linear drive is lowest at the initial location (where the aerosol impinges on the peripheral edge of the substrate), while at the end of the linear sweep (where the aerosol impinges on the central region of the substrate) the velocity is at a maximum. In this way, the surface of the substrate can be uniformly exposed to the cleaning aerosol. It is important to note that in this type of scanning system there is a singularity at the center of rotation which makes it difficult to avoid an over-exposure in the central region of the substrate. Therefore, this scanning method should not be used for processes that are sensitive to over-exposure.

When the gas-liquid transition temperature of the process gases are very close it may be also advantageous to introduce one or more process gases through a manifold 238 placed after the heat exchanger. This assures that some fraction of the gases will remain in gaseous form. This may be important because it effects the velocity of the jet exiting the nozzle. Also, introducing the carrier gas after the heat exchanger reduces the cooling power requirements of the pre-cooler or heat exchanger 202 since the carrier gas is not cooled.

Figure 8:
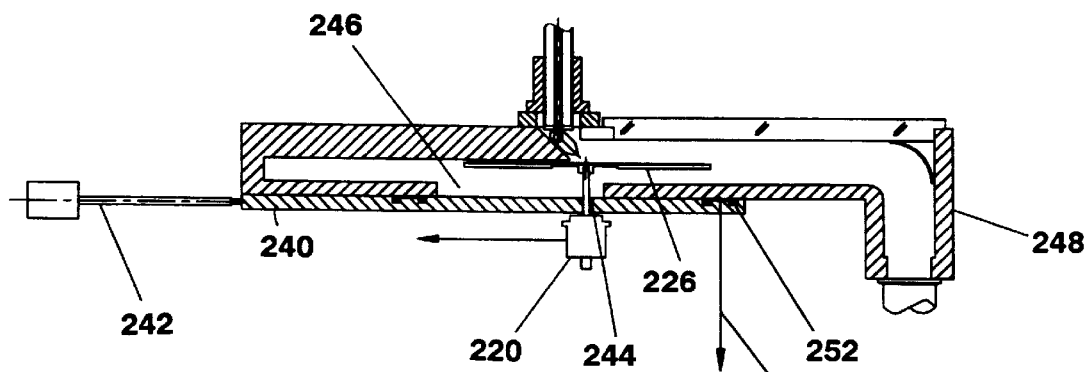
FIGS. 8 and 9 are cross-sectional side views of alternative scanning systems.

Referring to FIG. 8, in an alternative embodiment, the linear motion is not exerted through the shaft but by a sliding stage 240 driven by the linear actuator 242. The rotary motor 220 is now outside the vacuum and connected to the substrate holder 226 through a sealed shaft 244 and a slot 246 in stage 240. One or more concentric O-rings 252 placed on sliding stage 240 provide the vacuum seal against the bottom of chamber 248. It may be advantageous to add one or more pumping stages 250 between the concentric O-rings 252 to decrease the likelihood of vacuum leaks and to induce a positive pressure differential between the vacuum chamber, which is typically maintained at a pressure of a fraction of an atmosphere, and the pumping stage 250. In this way, any contamination produced at the O-ring seals will be driven away from the process chamber.

Figure 9:
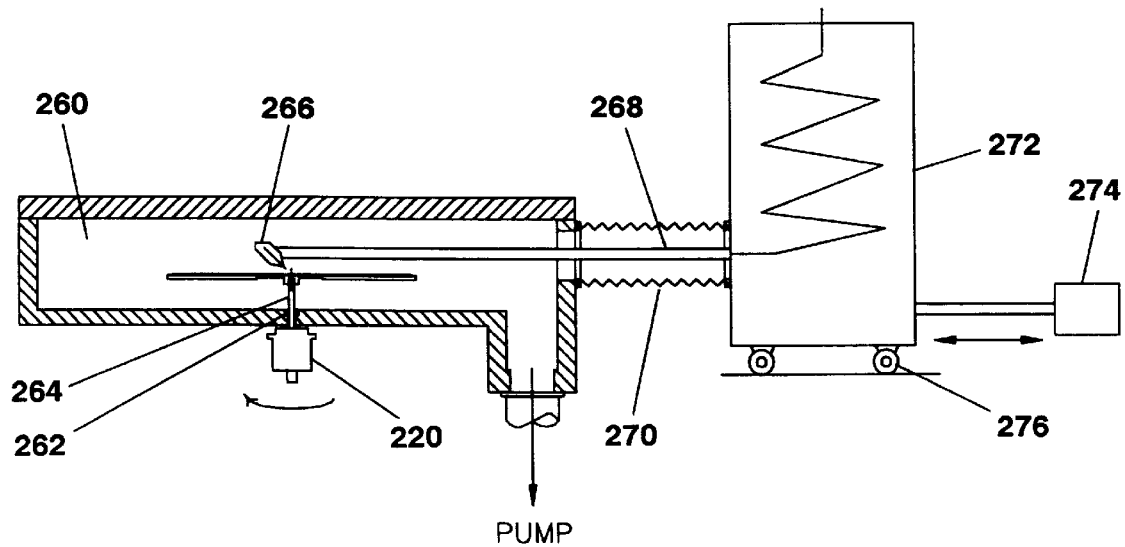

In a further embodiment, shown in FIG. 9, two-dimensional exposure of the substrate to the cleaning aerosol is achieved by a combination of slow linear translation of the nozzle and fast rotation of the substrate. A rotary motor 220, which is positioned outside the vacuum chamber 260, drives a vacuum-sealed shaft 262, attached to a substrate holder 264, causing a substrate to be cleaned to be under nozzle 266. The linear motion necessary to expose the whole surface of the substrate is achieved by translation of the nozzle 266. The cryogenic mixture, which has been pre-cooled in a heat exchanger 272, is carried to the nozzle by the tube 268 concentric with the bellows 270. The necessary linear translation of the nozzle is achieved by moving heat exchanger 272 with actuator 274. To facilitate this motion, it is advantageous to rest the heat exchanger on bearings 276.

Hand-Held Cleaners

In certain embodiments, the aerosol cleaner may be implemented as a hand-held cleaner.

Figure 10:
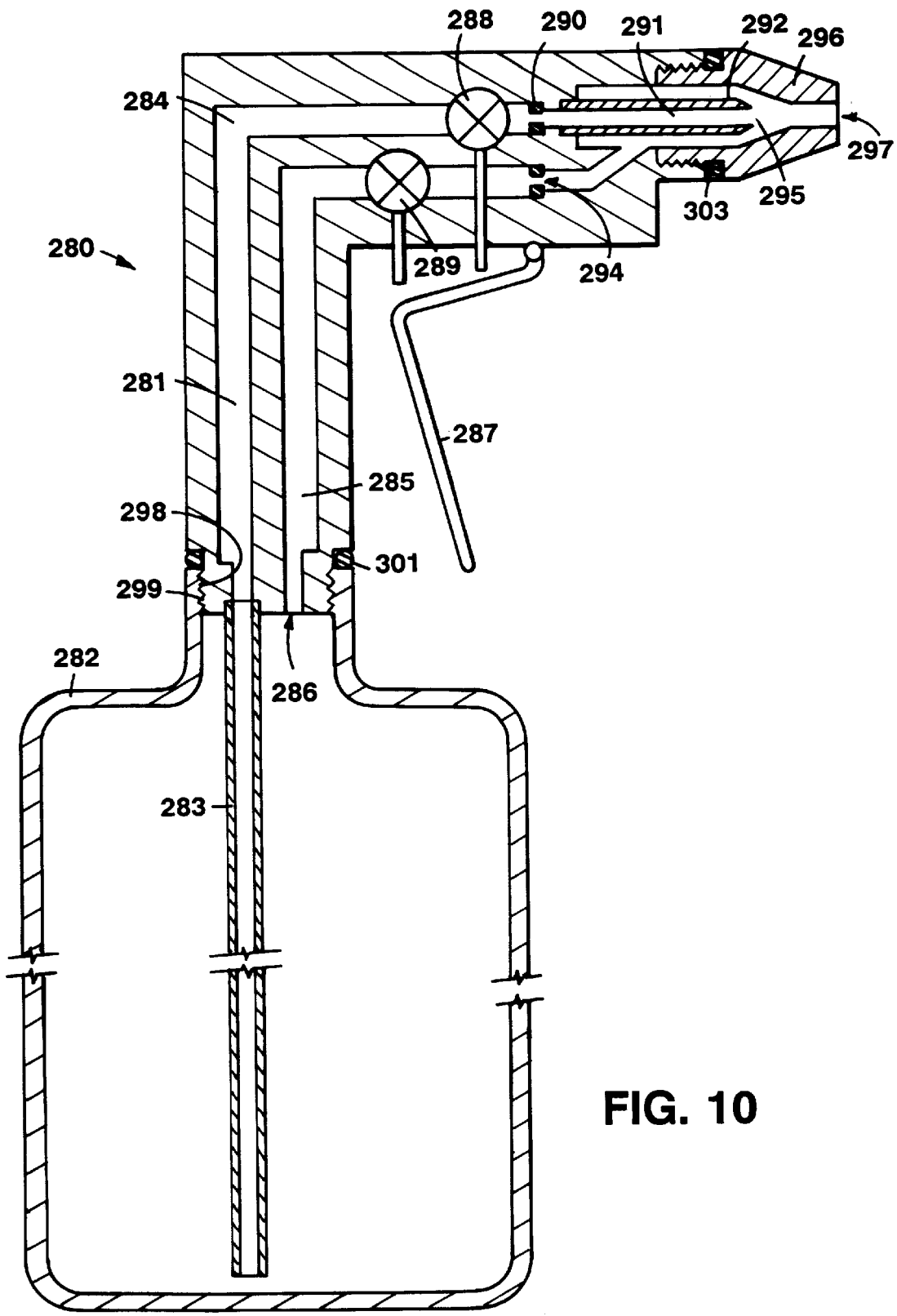
FIG. 10 is a diagrammatic side view of a hand-held surface processing system.

Referring to FIG. 10, in one presently preferred embodiment, a hand-held cleaner 280 includes a nozzle 281 that screws onto a high pressure cylinder 282 containing carbon dioxide liquid at a pressure of about 850 psi and at a temperature of 300° K (e.g., available from Parker-Cliff Impact Division of Ohio, U.S.A.). A feed tube 283 extends nearly to the bottom of cylinder 282 and couples to a liquid channel 284. A gas channel 285 has an opening 286 positioned near the top of cylinder 282. A hand-actuated trigger 287 activates liquid and gas valves 288, 289 to selectively allow passage of liquid and gas through channels 284, 285, respectively.

Upon activation of liquid valve 288, liquid carbon dioxide passes through an aerosol-generating orifice 290 (e.g., a sapphire disk having a hole therethrough with a diameter of 0.003 inch) and into a plenum 291 defined by a stainless steel tube 292 having an outlet 293. After exiting outlet 293, the liquid carbon dioxide forms an aerosol of liquid or solid particles. Activation of gas valve 189 allows pressurized carbon dioxide gas at the top of cylinder 282 to flow through an orifice 294 (e.g., having a diameter of 0.007 inch) and into a mixing zone 295. In mixing zone 295, the aerosol particles are entrained by the flow of pressurized carbon dioxide gas and accelerated through a converging/diverging nozzle portion 296 to at least sonic velocities at the outlet 297 of nozzle portion 296.

Nozzle 281 is formed from metal (e.g., brass, stainless steel, or aluminum) and includes threads 298 for mating with threads 299 of cylinder 282. An O-ring seal 301 is provided to provide a tight seal. A second O-ring seal 303 is provided between nozzle portion 296 and the base of the nozzle.

Figure 11A:
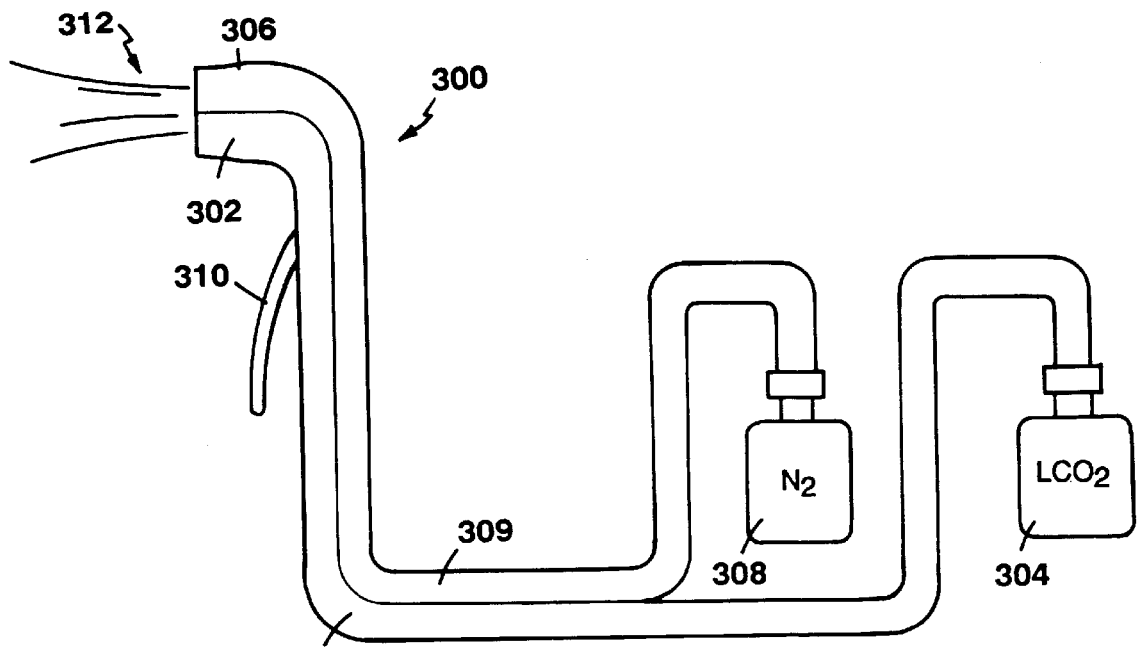
FIGS. 11 and 11A are diagrammatic side views of alternative hand-held surface processing systems.
Figure 11:
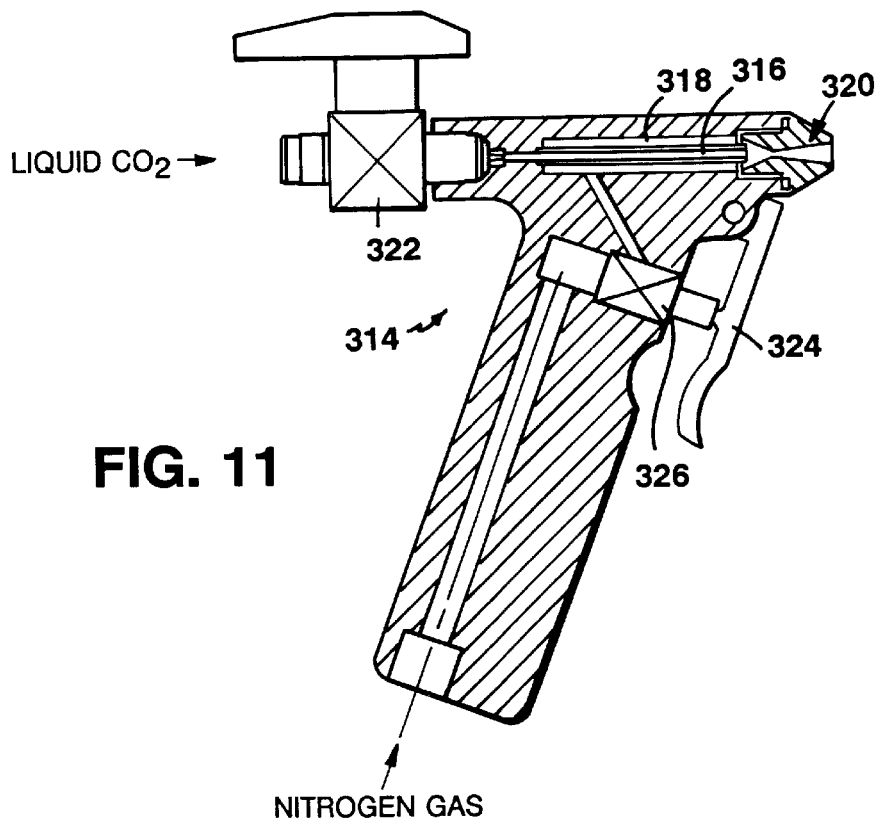

As shown in FIG. 11, in an alternative hand-held cleaner 314, a liquid feedtube 316, e.g., for delivering liquid carbon dioxide, and a carrier gas feedtube 318, e.g., for delivering pressurized nitrogen gas, are implemented coaxially. Feedtubes 316, 318 terminate at the proximal end of a supersonic nozzle 320, which is preferably shaped as a converging-diverging nozzle so that the carrier gas and the entrained liquid droplets may be accelerated to sonic or supersonic velocities. A valve 322 is used to control the quantity of liquid carbon dioxide supplied to hand-held cleaner 314. A handle 324 actuates a valve 326 to regulate the influx of the carrier gas into the cleaner.

Referring to FIG. 11A, in a further embodiment, a hand-held carbon dioxide aerosol cleaner 300 includes an expansion nozzle 302 for creating fine aerosol particles from, e.g., liquid carbon dioxide supplied via a liquid feedtube 303 from a supply 304. The resulting carbon dioxide particles are accelerated to high velocities (e.g., 10,000–30,000 cm/sec, or greater) by a carrier gas delivery nozzle 306, which provides a carrier gas (e.g., $N_2$) from a supply 308 via a carrier gas feedtube 309. Nozzle 306 is preferably shaped as a converging-diverging nozzle to accelerate the carrier gas to sonic or supersonic velocities. A pistol-grip handle 310 is provided to selectively provide a cleaning carbon dioxide aerosol 312 in the vicinity of a surface to be cleaned.

Using hand-held cleaners is particularly useful for substrates that are too large to be placed inside a vacuum chamber. Use of a hand-held cleaner also increases throughput (e.g., because the doors of the vacuum chamber do not have to be opened and closed). For example, held-held aerosol cleaners can be used to clean ion source assemblies used in ion implantation equipment. Ion source assemblies must be thoroughly cleaned before being installed within the ion implanter. Good cleaning results have been achieved using hand-held aerosol cleaners using carbon dioxide aerosols.

Aerosol Generation

The liquid used to form the aerosol can be used alone or it can be mixed with another high purity substance, e.g., high purity nitrogen, which may serve as a carrier gas or as a diluent. If a carrier gas (e.g., nitrogen, argon, helium, hydrogen, oxygen, ammonia, and ozone, or various combinations of these gases) is used, the carrier gas preferably remains in the gaseous phase to impart high velocities to the frozen aerosol particles. The additional high purity material (e.g., nitrogen, helium, neon, or hydrogen) may also serve as a diluent which provides a way to control the sizes and the velocities of the frozen aerosol particles by faster flashing (evaporation) and breakup of the liquid stream into smaller droplets caused by the emerging and expanding diluent.

Figure 12:
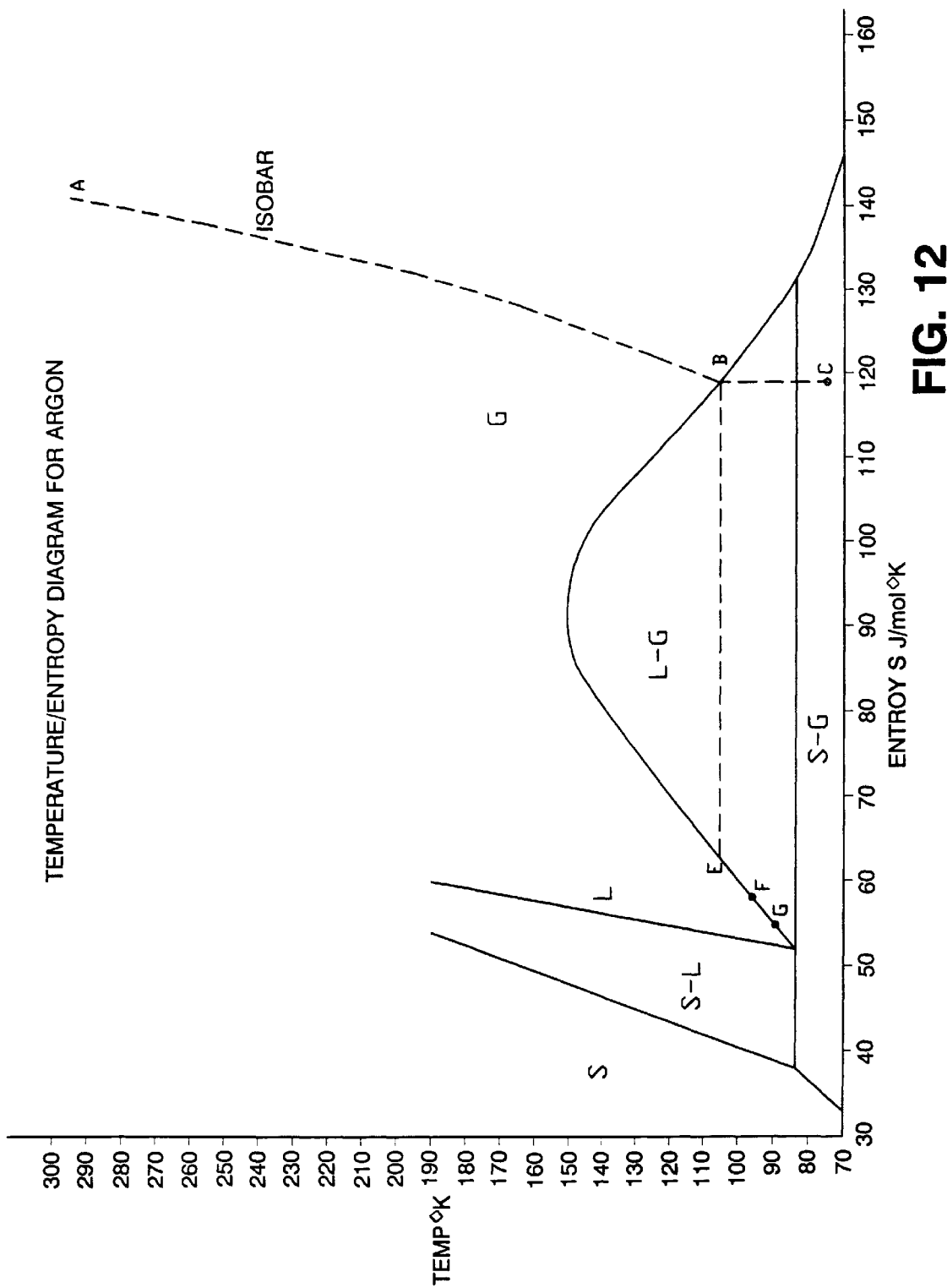
FIG. 12 is a temperature/entropy diagram for argon.

In one embodiment, an argon-containing aerosol is used to remove foreign material from the surface of a substrate to be cleaned. Argon is an inert material that is not detrimental to semiconductor wafers or microelectronic circuits. Also, argon can be economically produced with ultrahigh purity. In embodiments using argon, the temperature of the precooled argon or argon-containing mixture is typically in the range of 85° K to 110° K, and the pressure is maintained between 20 psi and 150 psi. The particle diameters are preferably controlled to be between 0.5 $\mu$m and 10 $\mu$m, and the particle velocities are preferably 10–300 m/sec (depending on the nature of the contaminant and the substrate). In the formation of an aerosol of at least partially frozen argon particles, a high purity argon gas is precooled to temperatures very close to liquefaction, shown as point B on the temperature v. entropy (TS) diagram of FIG. 12. An adiabatic expansion through an orifice further cools the gas causing it to become supersaturated (see, e.g, line BC on the TS diagram). At certain conditions of temperature (e.g., less than 83.8° K) and pressure (e.g., below 0.68 atm), supersaturation may induce homogeneous or heterogeneous nucleation resulting in condensation and formation of frozen argon particles.

EXAMPLE 1

The apparatus of FIG. 5 was used to remove a region of a layer of hard-baked photoresist, having a thickness of 1

µm, from the surface of a silicon wafer. The silicon wafer was linearly translated under the impinging aerosol at a translation rate of 0.75 cm/sec. The hard-baked photoresist was removed (as observed by visual inspection) in a single pass over an area of a width of 0.5 cm. The argon aerosol flow was 1.4 SCFM at a temperature of 95° K and the entraining nitrogen flow rate was 1.8 SCFM at a temperature of 295° K.

EXAMPLE 2

The apparatus of FIG. 5 was used to remove a region of a layer of ion implanted photoresist, having a thickness of 1 µm, from the surface of a silicon wafer. The silicon wafer was linearly translated under the impinging aerosol at a translation rate of 0.1 cm/sec. The ion implanted photoresist was removed (as observed by visual inspection) in a single pass over an area of a width of 0.5 cm. The argon aerosol flow was 1.4 SCFM at a temperature of 95° K and the entraining nitrogen flow rate was 1.8 SCFM at a temperature of 295° K.

EXAMPLE 3

The apparatus of FIG. 5 was used to remove fingerprints from a patterned silicon wafer. The silicon wafer was linearly translated under the impinging aerosol at a translation rate of 0.75 cm/sec. The fingerprints were removed (as observed by visual inspection) in a single pass over an area of a width of 0.5 cm. The argon aerosol flow was 1.4 SCFM at a temperature of 95° K and the entraining nitrogen flow rate was 1.8 SCFM at a temperature of 295° K.

EXAMPLE 4

The apparatus of FIG. 5 was used to remove a region of a layer of aluminum, having a thickness of 1 µm, from the surface of a quartz substrate. The quartz substrate was linearly translated under the impinging aerosol at a translation rate of 0.03 cm/sec. The aluminum layer was removed (as observed by visual inspection) in a single pass over an area with a width of 0.5 cm. The argon aerosol flow was 1.4 SCFM at a temperature of 95° K and the entraining nitrogen flow rate was 1.8 SCFM at a temperature of 295° K.

EXAMPLE 5

The hand-held cleaner of FIG. 11 was used to remove fingerprints from the surface of a silicon wafer. The fingerprints were removed (as observed by visual inspection) from the entire wafer surface. The carbon dioxide flow was 0.4 SCFM and the entraining nitrogen flow rate was 1.3 SCFM at 80 psi.

Other embodiments are within the scope of the claims.

For example, the substrate may be oriented vertically or upside-down to reduce the possibility of redeposit of the impact components resulting during the aerosol cleaning process.

Figure 13:
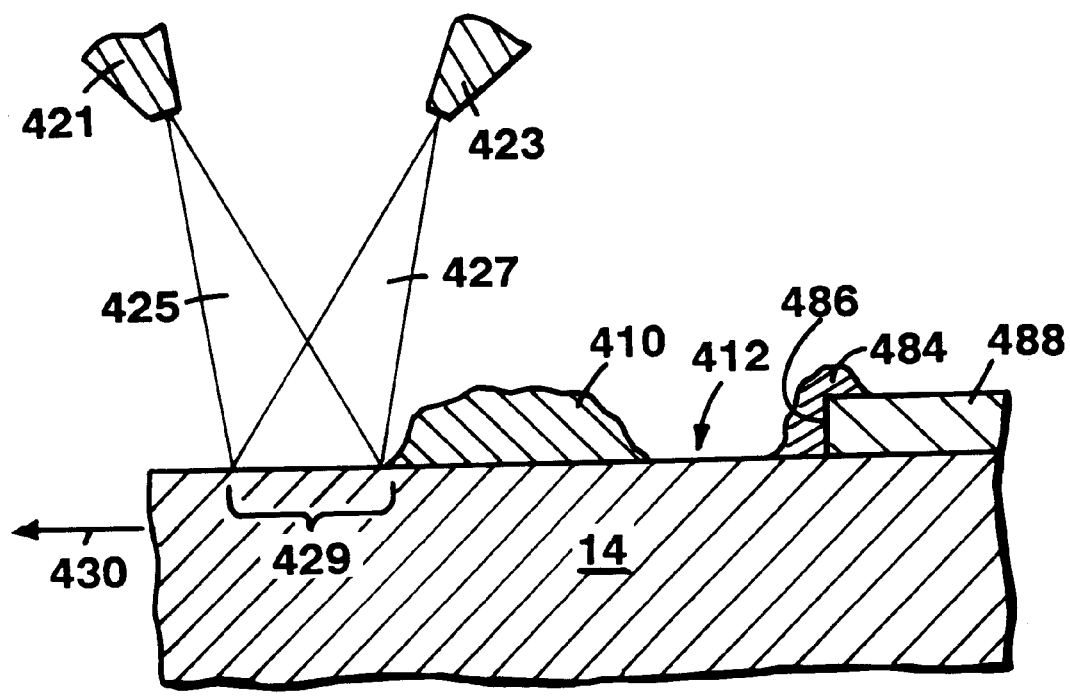
FIG. 13 is a diagrammatic side view of a substrate surface being processed by aerosols delivered from two expansion nozzles.

As shown in FIG. 13, the cleaning aerosol may be delivered to the surface of the substrate from one or more nozzles 421, 423 in the form of respective aerosol jets 425, 427. In a typical system, aerosol jets 425, 427 intersect in a relatively small area 429 of the substrate, while the substrate is scanned (i.e., translated) in the direction indicated by arrow 430. For example, in a semiconductor wafer cleaning system, each aerosol jet 425, 427 may only or typically cover about 0.1 cm$^2$ to 4 cm$^2$ of the wafer surface, whereas, e.g., 20 cm diameter wafers have surface areas greater than 300 cm$^2$. Relative motion is provided between the wafer and the cleaning aerosol, as described above, so that the entire wafer surface may be uniformly cleaned. This scheme provides multiple angles of incidence for alternate scan directions, facilitating removal of foreign material 484 from sidewalls 486 of a surface feature 488.

The new level of insight provided by the invention will enable those skilled in the art to conceive of many variations from the specific embodiments described herein without departing from the scope of the claims.

What is claimed is:

1. A method for removing foreign material from the surface of a substrate by directing a high velocity aerosol of at least partially frozen particles against foreign material to be removed, said method comprising the steps of:
   generating an aerosol of at least partially frozen particles;
   providing a flow of a gas having a temperature above the freezing point of the aerosol particles for entraining said aerosol of at least partially frozen particles;
   entraining said aerosol particles in said gas;
   accelerating said gas to at least sonic velocity; and
   delivering said entrained aerosol particles to foreign material to be removed from the surface of said substrate.

2. The method of claim 1 wherein said gas flow that is provided has a temperature of about 300° K.

3. The method of claim 1 wherein said step of entraining said aerosol particles in said gas flow is performed before said step of accelerating said gas to at least sonic velocity.

4. The method of claim 1 wherein said step of entraining said aerosol particles in said gas flow is performed after said step of accelerating said gas to at least sonic velocity.

5. The method of claim 1 wherein the foreign material to be removed comprises a layer of hard-baked photoresist.

6. The method of claim 1 wherein the foreign material to be removed comprises a layer of ion-implanted photoresist.

7. The method of claim 1 wherein the foreign material to be removed comprises fingerprints.

8. The method of claim 1 wherein said step of generating an aerosol comprises generating an aerosol of at least partially frozen argon particles.

9. The method of claim 1 wherein said step of generating an aerosol comprises generating an aerosol of at least partially frozen carbon dioxide particles.

10. A hand-held apparatus for removing foreign material from the surface of a substrate by directing a high velocity aerosol of frozen particles against the foreign material to be removed, said hand-held apparatus comprising:
    a housing having a liquid input port for receiving liquid and a carrier gas input port for receiving a carrier gas;
    a liquid feedtube having a proximal end coupled to the liquid input port and having a distal end for providing an aerosol of frozen particles;
    a carrier gas feedtube having a proximal end coupled to the carrier gas input port and having a distal end; and
    a high velocity gas nozzle having a proximal end coupled to the distal end of said gas feedtube and having a distal end located proximal to the foreign material to be removed from said substrate, said high velocity gas nozzle providing a high velocity flow of a gas that entrains said aerosol of frozen particles and delivers said frozen particles to said foreign material at a velocity substantially greater than the velocity of said particles prior to being entrained in said high velocity gas flow.

11. The hand-held apparatus of claim 10 wherein said liquid feedtube and said carrier gas feedtube are coaxially disposed about one another.

12. The hand-held apparatus of claim 10 wherein said liquid feedtube and said carrier gas feedtube are disposed side-by-side.

13. An apparatus for removing foreign material from the surface of a substrate, said apparatus coupling to a container of a pressurized liquid and directing a high velocity aerosol of at least partially frozen particles against foreign material to be removed, said apparatus comprising:
   an expansion nozzle having proximal and distal ends and defining a conduit having at least a portion that converges from the proximal end of the expansion nozzle to the distal end thereof for accelerating a gas therethrough;
   a liquid channel having a proximal end for extending within a container of a pressurized liquid and having a distal end with an opening for generating an aerosol of at least partially frozen particles from liquid passing through said liquid channel; and
   a gas channel having a proximal end with an opening at the top of the container of a pressurized liquid and having a distal end fluidly coupled to the proximal end of said expansion nozzle, said gas channel delivering a gas from the container of liquid to the vicinity of the distal end of said liquid channel for entraining the aerosol particles and accelerating the particles as the gas passes through said expansion nozzle.

14. The apparatus of claim 13 adapted to be hand-held and further comprising a hand-actuated trigger for selectively controlling the delivery of said high velocity aerosol to the foreign material to be removed.

15. A method of removing foreign material from the surface of a substrate disposed in a vacuum chamber by directing a high velocity aerosol of at least partially frozen particles against the foreign material to be removed, said method comprising:
   injecting into the vacuum chamber an aerosol jet containing at least partially frozen particles in a carrier gas;
   providing in the vacuum chamber a separate, high velocity flow of a gas of velocity substantially greater than the velocity of the aerosol particles in the aerosol jet; and intersecting said aerosol jet with said high velocity flow of gas, thereby accelerating said particles in said jet toward the foreign material at a velocity substantially greater than the original velocity of the aerosol particles in the jet.

16. The method of claim 15 wherein said high velocity gas flow has a temperature above the freezing point of the particles in the aerosol jet.

17. The method of claim 15 wherein said high velocity gas flow has a temperature of about 300° K.

18. The method of claim 15 wherein said aerosol particles are accelerated to at least sonic velocity.

19. The method of claim 15 wherein the foreign material to be removed comprises a layer of hard-baked photoresist.

20. The method of claim 15 wherein the foreign material to be removed comprises a layer of ion-implanted photoresist.

21. The method of claim 15 wherein the foreign material to be removed comprises fingerprints.

22. The method of claim 15 wherein said step of generating an aerosol jet comprises generating an aerosol jet of at least partially frozen argon particles.

23. The method of claim 15 wherein said step of generating an aerosol jet comprises generating an aerosol jet of at least partially frozen carbon dioxide particles.

24. The method of claim 15 wherein the accelerated jet particles are directed toward the foreign material at an angle of between about 20 and 60 degrees relative to a direction normal to the surface of the substrate.

25. The method of claim 15 wherein the step of generating the aerosol jet comprises adiabatically expanding pressurized liquid through a nozzle.

26. The method of claim 15 further comprising rotating the substrate while traversing a surface of the substrate with the high velocity gas flow with the accelerated aerosol particles.

27. The method of claim 15 further comprising:
   employing a liquid aerosol generator to provide a supply of liquid droplets entrained in a gas flow said liquid aerosol generator comprising a gas jet coupled to a supply of a gas for delivering an entraining flow of gas to said conduit, said entraining flow of gas atomizing liquid into liquid droplets and entraining said liquid droplets; and
   conducting said entrained flow of liquid droplets through a conduit coupled between said liquid aerosol generator and a plenum of an aerosol-forming expansion nozzle to deliver the entrained flow of liquid droplets over a substantial path from said liquid aerosol generator to said plenum, said liquid droplets entrained in said gas flow entering said vacuum chamber through at least one orifice, the pressure differential experienced by the liquid droplets as they pass into said vacuum chamber being selected so that said liquid droplets at least partially freeze to form said aerosol jet of frozen particles that impinge on and remove the foreign material from the surface of the substrate.

28. The method of claim 15 wherein said high velocity flow of gas is produced by a gas nozzle that is separate from a nozzle forming said aerosol jet, said gas nozzle serving to accelerate the frozen particles to at least about sonic velocities.

29. The method of claim 15 in which said aerosol of at least partially frozen particles is delivered at an oblique angle relative to the surface of said substrate.

30. The method of claim 15 in which multiple flows of said frozen particles are directed at the material along differing paths.

31. The method of claim 15 comprising providing at least two high velocity gas nozzles arranged so that their flows intersect the aerosol jet of frozen particles and direct the aerosol jet toward the material to be removed in at least two different directions.

32. The method of claim 15 adapted to provide a high velocity aerosol of at least partially frozen argon particles.

33. A method of removing foreign material from the surface of a substrate disposed in a vacuum chamber having a selected chamber pressure while foreign material is being removed from a substrate by directing a high velocity aerosol of at least partially frozen particles of argon against the foreign material to be removed, said method comprising
   providing an aerosol-forming expansion nozzle having a plenum and at least one orifice, and employing the at least one orifice to inject an aerosol jet containing at least partially frozen particles of argon in a carrier gas into said vacuum chamber; and
   providing a high velocity gas nozzle located proximal to the foreign material to be removed from said substrate, and employing said high velocity gas nozzle to provide a high velocity gas flow of velocity substantially greater than the velocity of the aerosol particles leaving the aerosol-expansion nozzle, the high velocity gas nozzle being arranged so that its high velocity gas flow entrains said aerosol of at least partially frozen argon particles and delivers said frozen particles to said foreign material at a velocity substantially greater than the velocity of said particles prior to being entrained in said high velocity gas flow.

34. The method of claim 33 wherein said flow from said high velocity gas nozzle is employed to accelerate the frozen particles to nearly sonic velocities.

35. The method of claim 33 wherein said high velocity gas nozzle is in the form of a cylindrical tube having a proximal conical section that converges to a throat coupled to a distal diverging conical section.

36. The method of claim 35 in which said aerosol of frozen particles is delivered at an oblique angle to the surface of said substrate.

37. The method of claim 33 including preselecting the size of said at least one orifice to control the average size of at least partially frozen particles in the aerosol used to remove the foreign material from said substrate.

38. A method of removing foreign material from the surface of a substrate by directing a high velocity aerosol of at least partially frozen particles against the foreign material to be removed, said apparatus comprising:

providing apparatus comprising a chamber having a top and a bottom and being adapted to contain a cooled liquid under pressure as a result of evaporation of the liquid at the top of the chamber into a gas;

a liquid flow channel having a proximal end, which extends into the chamber and terminates in the vicinity of the chamber bottom, and having a distal end which terminates at a liquid outlet;

an aerosol nozzle having a proximal end coupled to the liquid outlet of the liquid flow channel and having a distal end terminating at an aerosol-forming portion; and a gas flow channel having a proximal end located near the top of the chamber and having a distal end terminating at a gas outlet located in the vicinity of the aerosol-forming portion of the aerosol nozzle;

and operating the thus provided apparatus in the manner that cooled liquid under pressure at the bottom of the chamber flows into the proximal end of the liquid flow channel and out of the liquid outlet to form an aerosol of at least partially frozen particles, and gas evaporating from liquid at the top of the chamber flows under pressure into the proximal end of the gas flow channel and out of the distal end of the gas flow channel to accelerate the aerosol particles toward the foreign material to be removed.

39. The method of claim 38 in which the provided apparatus is constructed and arranged to be hand-held and further comprising a hand-actuatable control for selectively controlling the delivery of the accelerated aerosol particles to the foreign material to be removed, and holding the apparatus by hand and directing it to remove foreign material from the substrate.

40. The method of claim 38 or 39 wherein the cooled liquid comprises liquid carbon dioxide.

41. The method of claims 15 or 33 wherein the aerosol-forming expansion nozzle is connected to a supply enabling the production of a jet of argon particles in a nitrogen carrier gas, and the high velocity gas nozzle is connected to a source producing a high velocity flow of nitrogen.

42. The method of claim 15 or 33 wherein, in operation, the flow of gas from the high velocity gas nozzle is supersonic.

* * * * *